(12) United States Patent
Masaki et al.

(10) Patent No.: US 8,796,718 B2
(45) Date of Patent: Aug. 5, 2014

(54) LIGHT EMITTING ELEMENT AND METHOD FOR MANUFACTURING LIGHT EMITTING ELEMENT

(75) Inventors: Katsuaki Masaki, Kyoto (JP);
Yoshiyuki Kawaguchi, Kyoto (JP);
Kazuhiro Nishizono, Kyoto (JP)

(73) Assignee: Kyocera Corporation, Kyoto-Shi, Kyoto (JP)

( * ) Notice: Subject to any disclaimer, the term of this patent is extended or adjusted under 35 U.S.C. 154(b) by 0 days.

(21) Appl. No.: 13/499,136

(22) PCT Filed: Sep. 29, 2010

(86) PCT No.: PCT/JP2010/066969
§ 371 (c)(1),
(2), (4) Date: Mar. 29, 2012

(87) PCT Pub. No.: WO2011/040478
PCT Pub. Date: Apr. 7, 2011

(65) Prior Publication Data
US 2012/0187442 A1    Jul. 26, 2012

(30) Foreign Application Priority Data
Sep. 30, 2009    (JP) .................................. 2009-226248

(51) Int. Cl.
*H01L 33/00*    (2010.01)
(52) U.S. Cl.
USPC ...................................... 257/98; 257/E33.063
(58) Field of Classification Search
CPC ......... H01L 33/22; H01L 33/60; H01L 33/42; H01L 2924/12041
USPC .................... 438/29, 42–44, 46; 257/98–100, 257/E33.062–E33.065
See application file for complete search history.

(56) References Cited

U.S. PATENT DOCUMENTS

| | | | | |
|---|---|---|---|---|
| 7,372,081 | B2 * | 5/2008 | Song et al. ...................... | 257/99 |
| 8,227,823 | B2 * | 7/2012 | Bae ................................. | 257/98 |
| 2004/0169191 | A1 * | 9/2004 | Udagawa ........................ | 257/99 |
| 2005/0104081 | A1 * | 5/2005 | Kim et al. ....................... | 257/99 |
| 2005/0179130 | A1 | 8/2005 | Tanaka et al. | |
| 2006/0186424 | A1 | 8/2006 | Fujimoto et al. | |
| 2006/0270206 | A1 | 11/2006 | Cho et al. | |
| 2010/0096660 | A1 * | 4/2010 | Jeong ............................. | 257/99 |
| 2010/0127297 | A1 * | 5/2010 | Jeong ............................. | 257/98 |
| 2010/0295088 | A1 * | 11/2010 | D'Evelyn et al. ............... | 257/99 |
| 2010/0295988 | A1 * | 11/2010 | Shimoda ........................ | 348/372 |
| 2011/0127489 | A1 * | 6/2011 | Lee et al. ........................ | 257/13 |
| 2012/0018764 | A1 * | 1/2012 | Choi et al. ...................... | 257/99 |

FOREIGN PATENT DOCUMENTS

| | | |
|---|---|---|
| JP | 2000188421 | 7/2000 |
| JP | 2006222288 | 8/2006 |
| JP | 2006324661 | 11/2006 |
| JP | 2008010894 | 1/2008 |

* cited by examiner

*Primary Examiner* — Matthew W Such
*Assistant Examiner* — Ali Naraghi
(74) *Attorney, Agent, or Firm* — Volpe and Koenig, P.C.

(57) ABSTRACT

A light emitting element includes an optical semiconductor layer (2) obtained by sequentially laminating a first semiconductor layer (2a), a light emitting layer (2b), and a second semiconductor layer (2c); a first electrode layer (3) that is electrically connected to the first semiconductor layer (2a); and a second electrode layer (7) that is electrically connected to the second semiconductor layer (2c). The second electrode layer (7) includes a conductive reflecting layer (4) positioned on the second semiconductor layer (2c), and a conductive layer (5) having a plurality of through holes (6) that are positioned on the conductive reflecting layer (4) and penetrate therethrough in a thickness direction thereof.

15 Claims, 10 Drawing Sheets

US 8,796,718 B2

LIGHT EMITTING ELEMENT AND METHOD FOR MANUFACTURING LIGHT EMITTING ELEMENT

TECHNICAL FIELD

The present invention relates to a light emitting element, and a method for manufacturing a light emitting element.

BACKGROUND ART

Currently, light emitting elements emitting ultraviolet light, blue light, green light, and the like have been developed. As such a light emitting element, there is a light emitting element constituted by, for example, an optical semiconductor layer in which a plurality of semiconductor layers are stacked and electrodes which apply voltage to the optical semiconductor layer (refer to, for example, Japanese Unexamined Patent Publication JP-A 2006-222288).

In the development of such a light emitting element, the improvement of electric characteristics between an optical semiconductor layer and an electrode has been demanded.

DISCLOSURE OF INVENTION

A light emitting element according to an embodiment of the invention includes an optical semiconductor layer obtained by sequentially laminating a first semiconductor layer, a light emitting layer, and a second semiconductor layer; a first electrode layer that is electrically connected to the first semiconductor layer; and a second electrode layer that is electrically connected to the second semiconductor layer. In addition, the second electrode layer includes a conductive reflecting layer positioned on the second semiconductor layer, and a conductive layer, that are positioned on the conductive reflecting layer, having a plurality of through holes that penetrate therethrough in a thickness direction thereof.

A method for manufacturing a light emitting element according to an embodiment of the invention includes preparing a stacked body obtained by sequentially laminating an optical semiconductor layer, a first metal layer, and a second metal layer having a higher melting point than that of an oxide of the first metal layer; and forming a plurality of through holes that penetrate the second metal layer in a thickness direction thereof. In addition, the method for manufacturing a light emitting element according to the embodiment of the invention includes oxidizing, in the stacked body, an interfacial area with the first metal layer by heating the stacked body at a temperature that is higher than the melting point of an oxide of the first metal layer and is lower than a melting point of the first metal layer and the melting point of the second metal layer.

DESCRIPTION OF EMBODIMENTS

Embodiments of a light emitting element according to the invention will be described in detail with reference to the following drawings.

The invention is not limited to the embodiments below, and can be variously modified within the scope not departing from the gist of the invention.

<Regarding Light Emitting Element>

Figure 1:
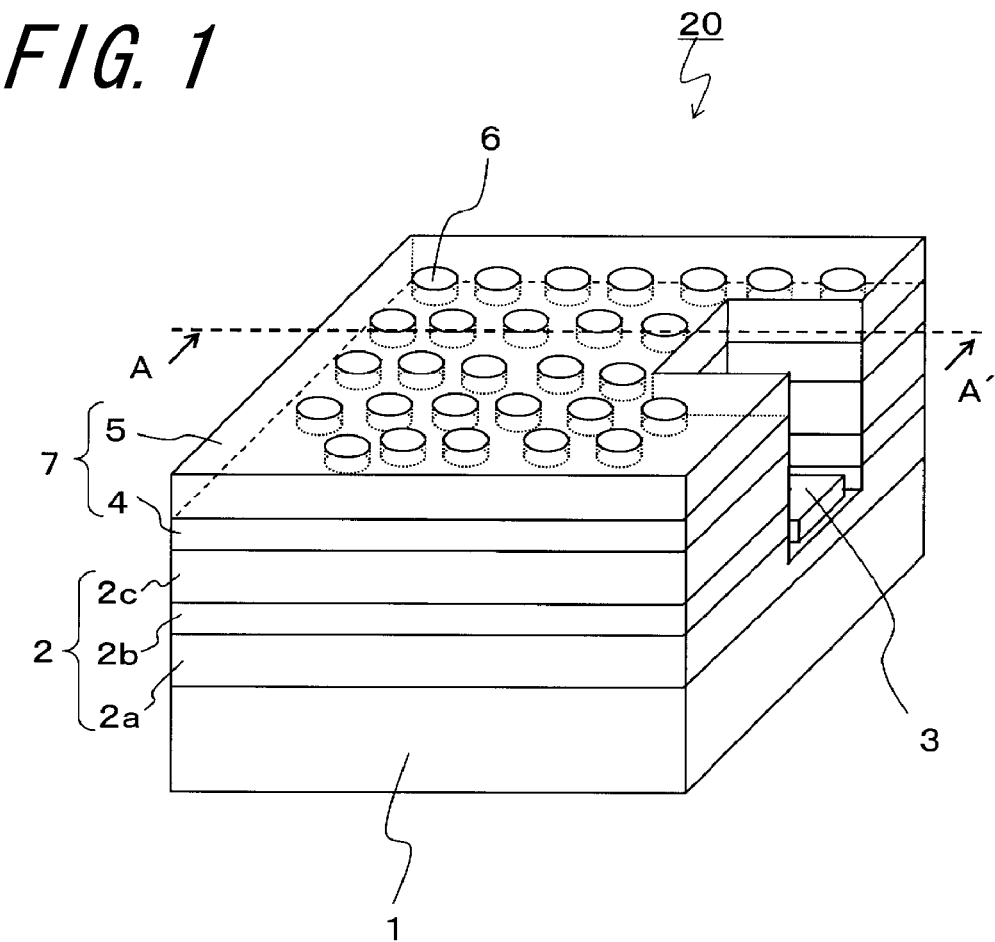
FIG. 1 is a perspective view of a light emitting element according to an embodiment.
Figure 2:
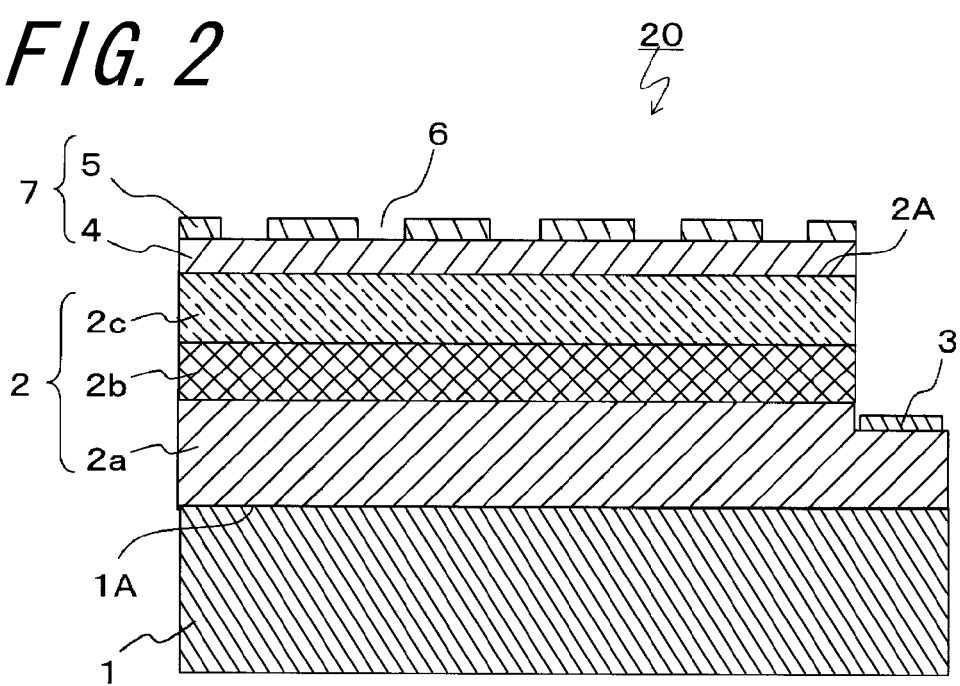
FIG. 2 is a cross-sectional view of the light emitting element shown in FIG. 1, and corresponds to a cross-section taken along the line A-A' of FIG. 1.

FIG. 1 is a perspective view of a light emitting element 20 according to an embodiment, and FIG. 2 is a cross-sectional view of the light emitting element 20 shown in FIG. 1 and corresponds to a cross-section taken along the line A-A' of FIG. 1.

The light emitting element 20 includes a substrate 1, an optical semiconductor layer 2 formed on the substrate 1, a first electrode layer 3 electrically connected to a part of the optical semiconductor layer 2, and a second electrode layer 7 that has a conductive reflecting layer 4 and a conductive layer 5 having a plurality of through holes 6, as shown in FIGS. 1 and 2.

The substrate 1 may be one that enables the optical semiconductor layer 2 to grow using the chemical vapor deposition. The substrate 1 is formed of a flat plate in a shape of polygon such as a square shape, or circle. As the material used in the substrate 1, for example, sapphire, a gallium nitride, an aluminum nitride, a zinc oxide, a silicon carbide, silicon, a zirconium diboride, or the like can be exemplified.

When light emitted from the optical semiconductor layer 2 is taken out from the substrate 1 side, a method of using a transparent base material through which the light emitted from the optical semiconductor layer 2 is transmitted can be used. As a transparent base material, the wavelength of the light emitted from the optical semiconductor layer 2 may be taken into consideration, and when the configuration of a light emitting layer 2b described later is used, for example, it is possible to use, for example, sapphire, gallium nitride, zinc oxide, silicon carbide, or the like. In the embodiment, the substrate 1 is made of sapphire, and the thickness of the substrate 1 is about within a range of 10 μm or more and 1000 μm or less.

The optical semiconductor layer 2 includes a first semiconductor layer 2a formed on a main face 1A of the substrate 1, the light emitting layer 2b formed on the first semiconductor layer 2a, and a second semiconductor layer 2c formed on the light emitting layer 2b, as shown in FIG. 2.

As the first semiconductor layer 2a, the light emitting layer 2b, and the second semiconductor layer 2c, it is possible to use, for example, a group III-V semiconductor. As a specific group III-V semiconductor, a group III nitride semiconductor, gallium phosphide, gallium arsenide, or the like can be exemplified. As a group III nitride semiconductor, for example, gallium nitride, aluminum nitride, indium nitride, or the like can be used, and if expressed with a chemical formula, it is $Al_{x1}Ga_{(1-x1-y)}In_{y1}N(0 \leq x1 \leq 1, 0 \leq y1 \leq 1, x1+y1 \leq 1)$. As the first semiconductor layer 2a, the light emitting layer 2b, and the second semiconductor layer 2c, for example, zinc oxide, or the like can be used other than the group III-V semiconductor.

The optical semiconductor layer 2 includes the first semiconductor layer 2a, the light emitting layer 2b, and the second semiconductor layer 2c sequentially formed on the main face 1A of the substrate 1 so as to have a stacked structure. The first semiconductor layer 2a is set to exhibit the properties of an n-type semiconductor as a one conductivity type, and the second semiconductor layer 2c is set to exhibit the properties of a p-type semiconductor of a conductivity type opposite to the first semiconductor layer 2a. In this embodiment, the first semiconductor layer 2a and the second semiconductor layer 2c are formed of a gallium nitride that is a group III nitride semiconductor.

When an n-type gallium nitride is used for the first semiconductor layer 2a made of a gallium nitride, for example, an element in group IV in the periodic table of the elements may be added to the gallium nitride as a dopant. As a dopant of an element in group IV, for example, silicon, or the like can be used. The thickness of the first semiconductor layer 2a can be set to be, for example, within a range of 0.5 μm or more and 200 μm or less.

When a p-type gallium nitride is used for the second semiconductor layer 2c made of a gallium nitride, for example, an element in group II in the periodic table of the elements may be added as a dopant. As a dopant of an element in group II, for example, magnesium, or the like can be used. The thickness of the second semiconductor layer 2c can be set to be, for example, within a range of 0.5 μm or more and 2 μm or less.

The light emitting layer 2b is provided between the first semiconductor layer 2a and the second semiconductor layer 2c. The light emitting layer 2b may have, for example, a multi quantum well (abbreviated as MQW) structure. The multi quantum well structure is formed such that quantum well structures constituted by a barrier layer having a wide forbidden band width and a well layer having a narrow forbidden band width are repeatedly stacked plural times (for example, within a range of 2 times or more and 10 times or less). The thickness of the entire light emitting layer 2b can be set to be, for example, within a range of 25 nm and 150 nm or less.

As a barrier layer, it is possible to use, for example, an $In_{0.01}Ga_{0.99}N$ layer, or the like. As a well layer, it is possible to use, for example, an $In_{0.11}Ga_{0.89}N$ layer, or the like. In this case, the thickness of the barrier layer can be set to be, for example, within a range of 2 nm or more and 15 nm or less, and the thickness of the well layer can be set to be, for example, within a range of 2 nm and 10 nm or less. The light emitting layer 2b configured as above emits light with a wavelength, for example, within a range of 350 nm and 600 nm or less.

The optical semiconductor layer 2 is provided with the first electrode layer 3 and the second electrode layer 7. The first electrode layer 3 is electrically connected to the first semiconductor layer 2a, and the second electrode layer 7 is electrically connected to the second semiconductor layer 2c. The light emitting element 20 can cause the optical semiconductor layer 2 to emit light by applying voltage between the first electrode layer 3 and the second electrode layer 7. In the embodiment, the first electrode layer 3 and the second electrode layer 7 are disposed in the same side of the optical semiconductor layer 2 and in the opposite side to the substrate 1 for the optical semiconductor layer 2.

The first electrode layer 3 is electrically connected to the first semiconductor layer 2a. The first electrode layer 3 is provided in the exposure area of the first semiconductor layer 2a that is exposed by removing a part of the second electrode layer 2c and a part of the light emitting layer 2b.

As the first electrode layer 3, it is possible to use a metal material, for example, aluminum, titanium, nickel, chromium, indium, tin, molybdenum, silver, gold, niobium, tantalum, vanadium, platinum, lead, beryllium, or the like. Furthermore, as the first electrode layer 3, for example, a metal oxide such as a tin oxide, an indium oxide, an indium tin oxide, or the like, or an alloy having the above-described metal material as the main component may be used. As an alloy having the above-described metal material as the main component, for example, an alloy such as an alloy of gold and silicon, an alloy of gold and germanium, an alloy of gold and zinc, an alloy of gold and beryllium, or the like can be used.

The first electrode 3 may be set to a layer obtained by laminating a plurality of layers of which the material is selected from the above-described metals, metal oxides, alloys, or the like. When gold is used as the first electrode 3, for example, it is possible to provide aluminum-interposed titanium as an ohmic contacting layer that causes ohmic contact between the first electrode 3 and the first semiconductor layer 2a. When the substrate 1 has conductivity, the first electrode 3 may be provided on the opposite side to the main face or a side face of the main face 1A of the substrate 1 on which the optical semiconductor layer 2 is formed.

The second electrode layer 7 is provided at a position on a main face 2A of the second semiconductor layer 2c, and electrically connected to the second semiconductor layer 2c. The second electrode layer 7 is configured by sequentially laminating the conductive reflecting layer 4 and the conductive layer 5.

The conductive reflecting layer 4 is formed on the main face 2A of the second semiconductor layer 2c so that the conductive reflecting layer 4 reflects light emitted from the light emitting layer 2b in the direction of the substrate 1. The conductive reflecting layer 4 is formed so as to cover, for example, 80% or more of the main face 2A of the second semiconductor layer 2C.

The conductive reflecting layer 4 is made of a conductive material that can reflect light emitted from the light emitting layer 2b in the direction of the substrate 1 and electrically connect the second semiconductor layer 2c and the second electrode layer 7. The thickness of the conductive reflecting layer 4 is set to be, for example, within a range of 2 nm or more and 2000 nm or less.

For the conductive reflecting layer 4, it is possible to use a metal material, specifically such as, aluminum, titanium, nickel, chromium, indium, tin, molybdenum, silver, gold, niobium, tantalum, vanadium, platinum, lead, beryllium, or the like. Furthermore, as the conductive reflecting layer 4, a metal oxide such as a tin oxide, an indium oxide, an indium tin oxide, or the like, or an alloy having the above-described metal material as the main component may be used. As an alloy having the above-described metal material as the main component, for example, an alloy such as an alloy of silver and gallium, an alloy of silver and aluminum, an alloy of gold and silicon, an alloy of gold and germanium, an alloy of gold and zinc, an alloy of gold and beryllium, or the like can be appropriately used.

In the embodiment, since light emitted from the light emitting layer 2b has a wavelength, for example, within a range of 350 nm or more and 600 nm or less, silver is used as the conductive reflecting layer 4 in terms of reflectivity for a wavelength. In this case, the thickness of the conductive reflecting layer 4 is set to be, for example, within a range of 10 nm or more and 1000 nm or less.

The conductive layer 5 is formed so as to be disposed on a main face 4A of the conductive reflecting layer 4, and electrically connected to the conductive reflecting layer 4 and the second semiconductor layer 2c. The thickness of the conductive layer 5 is set to be, for example, within a range of 1 nm or more and 4000 nm or less. As the material of the conductive layer 5, it is possible to use a material different from that of the conductive reflecting layer 4, and may be selected from the above-described materials of the conductive reflecting layer 4.

In the embodiment, the conductive layer 5 is made of aluminum. In this case, the thickness of the conductive layer 5 is set to be, for example, within a range of 1 nm or more and 100 nm or less.

The conductive layer 5 has a plurality of through holes 6 that penetrate the conductive layer in the thickness direction. Part of the main face 4A of the conductive reflecting layer 4 is exposed from the conductive layer 5 through the plurality of through holes 6. The plurality of through holes 6 are provided so that the area of the conductive reflecting layer 4 exposed from the conductive layer 5 accounts for, for example, about within a range of 10% or more and 60% or less of the area of the main face 4A of the conductive reflecting layer 4.

Figure 3:
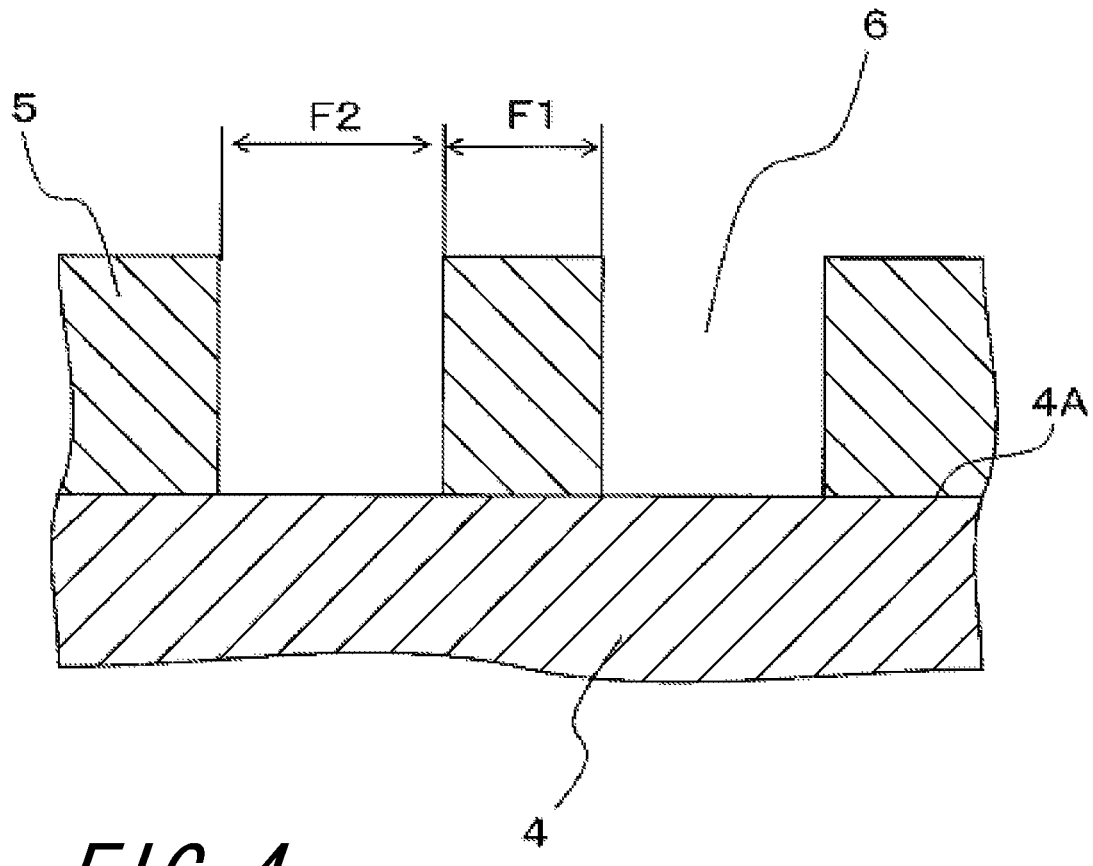
FIG. 3 is an enlarged cross-sectional view of a through hole, a conductive reflection layer, and a conductive layer of the light emitting element shown in FIG. 1.

The plurality of through holes 6 are configured such that a distance F1 between two adjacent the through holes 6, that is, a width of the conductive layer 5 positioned between adjacent two through holes 6 is, for example, within a range of 0.4 μm or more and 30 μm or less, as shown in FIG. 3. The shape of the through holes 6 is selected from a circular truncated cone, a circular column, a polygonal truncated cone, a polygonal column, and the like. The dimension F2 of the bottom face of the through hole 6, that is, the face of the upper face 4A of the conductive reflecting layer 4 exposed by the through hole 6 is set to have a diameter, for example, within a range of 0.02 μm or more and 50 μm or less. In the embodiment, the through holes 6 are formed in circular column shapes.

In the light emitting element 20 configured as above, the second electrode layer 7 has the plurality of through holes 6 that cause the conductive reflecting layer 4 to be exposed. For this reason, when the second semiconductor layer 2c and the conductive reflecting layer 4 are heated, it is possible to easily bring the conductive reflecting layer 4 into contact with oxygen.

As a result, it is possible to increase the amount of oxygen in the interfacial area in which the second semiconductor layer 2c comes into contact with the conductive reflecting layer 4. Accordingly, ohmic contact is formed between the second semiconductor layer 2c and the conductive reflecting layer 4, whereby it is possible to reduce a contact resistance value between the second semiconductor layer 2c and the conductive reflecting layer 4. For this reason, it is possible to enhance electric properties of the optical semiconductor layer 2 and the second electrode layer 7.

Herein, a contact resistance value between the second semiconductor layer 2c and the conductive reflecting layer 4 represents an electric resistance value present in the contact face between the second semiconductor layer 2c and the conductive reflecting layer 4. On the contact face between the second semiconductor layer 2c and the conductive reflecting layer 4, there is a contact potential difference and a discontinuous potential difference corresponding to current flowing to the contact face, and a ratio between the difference and current is a contact resistance value.

On the other hand, in a case of a light emitting element configured such that a conductive layer without a through hole is provided on a conductive reflecting layer, it was difficult to increase the amount of oxygen in the interfacial area in which an optical semiconductor layer comes into contact with the conductive reflecting layer. For this reason, a contact resistance value between the optical semiconductor layer and the conductive reflecting layer was high, which led to a drop in light emitting efficiency of the optical semiconductor layer.

Furthermore, since the conductive layer 5 of the light emitting element 20 in the embodiment has the plurality of through holes 6, part of the upper face 4A of the conductive reflecting layer 4 can be exposed, the distance between the outside and the second semiconductor layer 2c positioned so as to overlap with the conductive reflecting layer 4 exposed by the through holes 6 in a transparent plan view can be shortened, and being high temperature of the second semiconductor layer 2c can be suppressed.

In addition, in comparison to a light emitting element configured such that a conductive layer without a through hole is provided on a conductive reflecting layer, the light emitting element 20 in the embodiment can be configured to have an increased surface area of the second electrode layer 7 contacting the outside since the electrode layer 5 has the through holes 6, and therefore, it is possible to enhance the heat dissipation efficiency of heat generated from the optical semiconductor layer 2.

(Regarding Various Modified Examples)

Figure 4:
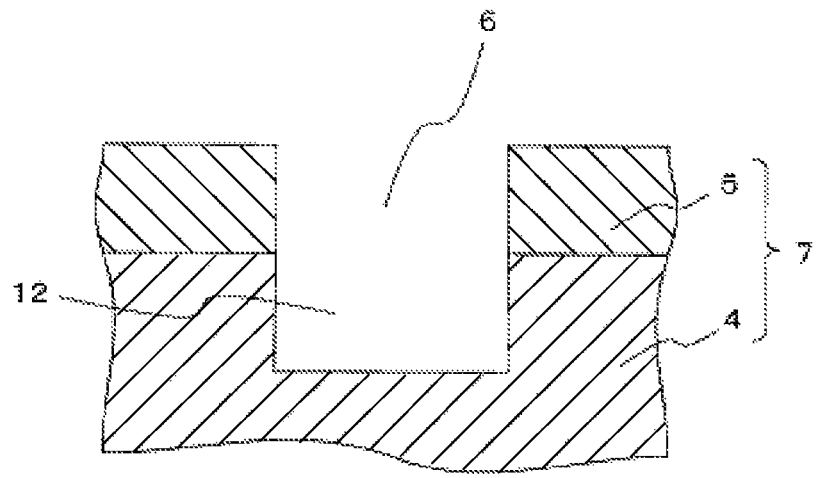
FIG. 4 is an enlarged cross-sectional view of the through hole, a recess portion, and the periphery thereof of the light emitting element shown in FIG. 1.

The conductive reflecting layer 4 may be provided with a recess 12 at a position corresponding to the through hole 6 of the conductive layer 5 as shown in FIG. 4. The recess 12 can use the shape of a circular column, a polygonal column, a circular truncated cone, a polygonal truncated cone, or the like. The diameter of the recess 12 may be set to the same size as that of the through hole 6, or set to be, for example, within a range of 0.02 μm or more and 3 μm or less. Since the conductive reflecting layer 4 has the recess 12, it is possible to increase the area in which the conductive reflecting layer 4 comes into contact with oxygen. Since it is possible to increase the surface area where the conductive reflecting layer 4 is exposed, it is possible to enhance the heat dissipation efficiency of heat generated from the optical semiconductor layer 2.

Figure 5:
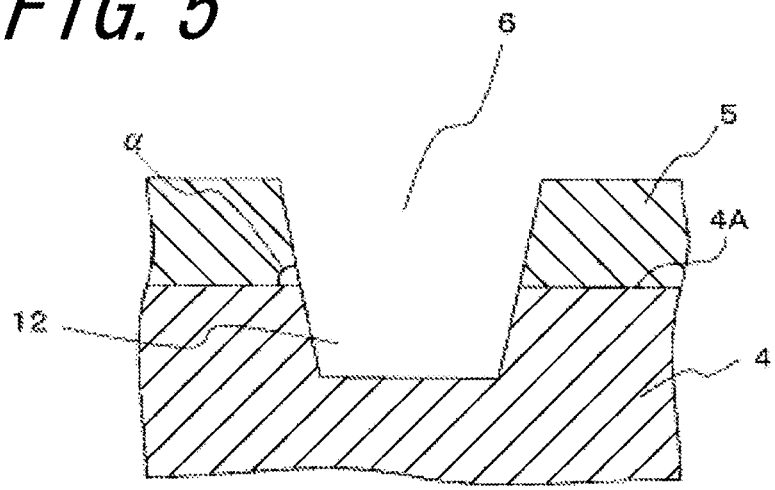
FIG. 5 is an enlarged cross-sectional view of a through hole, a recess portion, and the periphery thereof of a modified example of the light emitting element shown in FIG. 1.

The recess 12 may be provided such that a first cross-sectional area that is the area of a cross-section perpendicular to the thickness direction of the conductive reflecting layer 4 increases along the side of the conductive layer 5 as shown in FIG. 5. In other words, for the recess 12, it is possible to use the shape in which the area of the upper face of the recess 12 is greater than the area of the base face of the recess 12. For the recess 12, it is possible to use, for example, a circular truncated cone shape, a polygonal truncated cone shape, or the like. With the provision of the recess 12 as above, it is possible to further increase the surface area in which the conductive reflecting layer 4 is exposed.

The through hole 6 may be provided such that a second cross-sectional area that is an area of a cross-section perpendicular to the thickness direction of the conductive layer 5 decreases along the side of the conductive reflecting layer 4 as shown in FIG. 5. In other words, the through hole 6 may be formed such that an angle α formed by a side 18 and the main face 4A of the conductive reflecting layer 4 is an acute angle in a cross-sectional view.

With the inclination of the side 18 of the through hole 6 to the main face 4A of the conductive reflecting layer 4 as above, the surface area can increase, and therefore, it is possible to further enhance heat dissipation efficiency. Furthermore, when a protective metal layer 13 to be described later is provided on the second electrode layer 7, the protective metal layer 13 can be provided on the inclined through hole 6 with high coatability.

Figure 6:
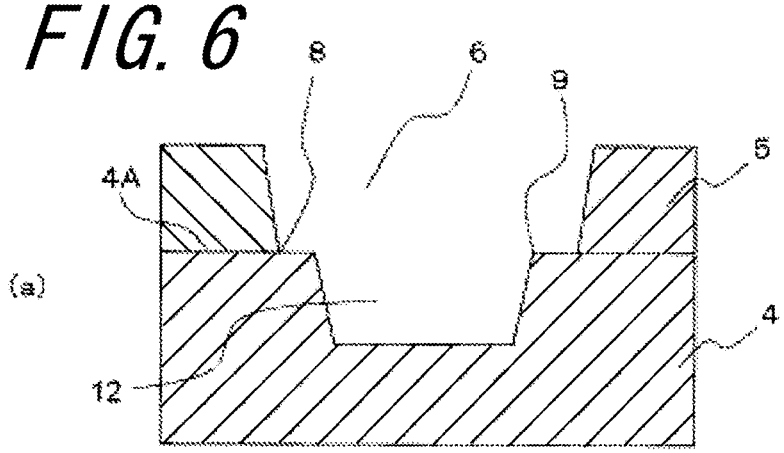
FIG. 6 is an enlarged view of a through hole, a recess portion, and the periphery thereof of a modified example of the light emitting element shown in FIG. 1, wherein FIG. 6(a) corresponds to an enlarged cross-sectional view of a cross-section that is cut in the thickness direction, and FIG. 6(b) corresponds to an enlarged planar view as viewed from the top.
Figure 6:
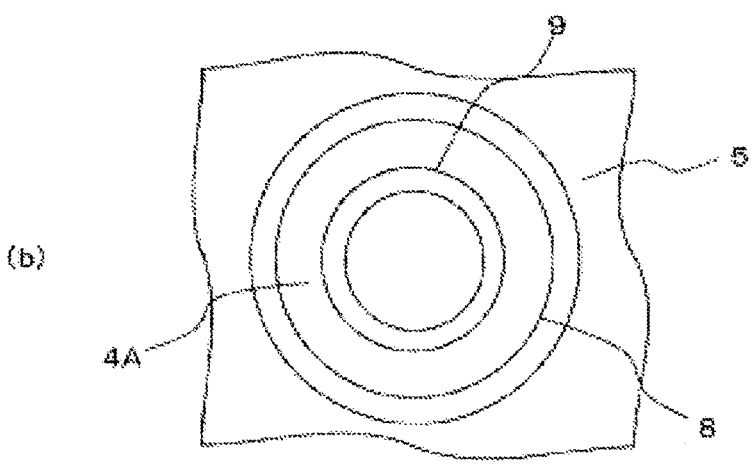

The recess 12 may be provided inside the through hole 6 in a transparent plan view as shown in FIG. 6. Specifically, in a transparent plan view of the through hole 6, an outer circumference of a first opening portion 8 of the through hole 6 may be provided at a position outside an outer circumference of a second opening portion 9 of the recess 12.

Herein, the first opening portion 8 refers to an opening portion in one end side of the through hole 6 positioned in the surface of the conductive layer 5 on the conductive reflecting layer 4 side, and the second opening portion 9 refers to an opening portion of the recess 12 positioned in the surface of the conductive reflecting layer 4 on the conductive layer 5 side.

The shape of the first opening portion 8 and the shape of the second opening portion 9 may be different from each other. The area of the first opening portion 8 is set to be, for example, within a range of 1.1 times or more and 2.5 times or less the area of the second opening portion 9. Since part of the upper face 4A of the conductive reflecting layer 4 can be exposed with the provision of the recess 12 and the through hole 6 as above, it is possible to increase the exposed surface area of the conductive reflecting layer 4.

Figure 7:
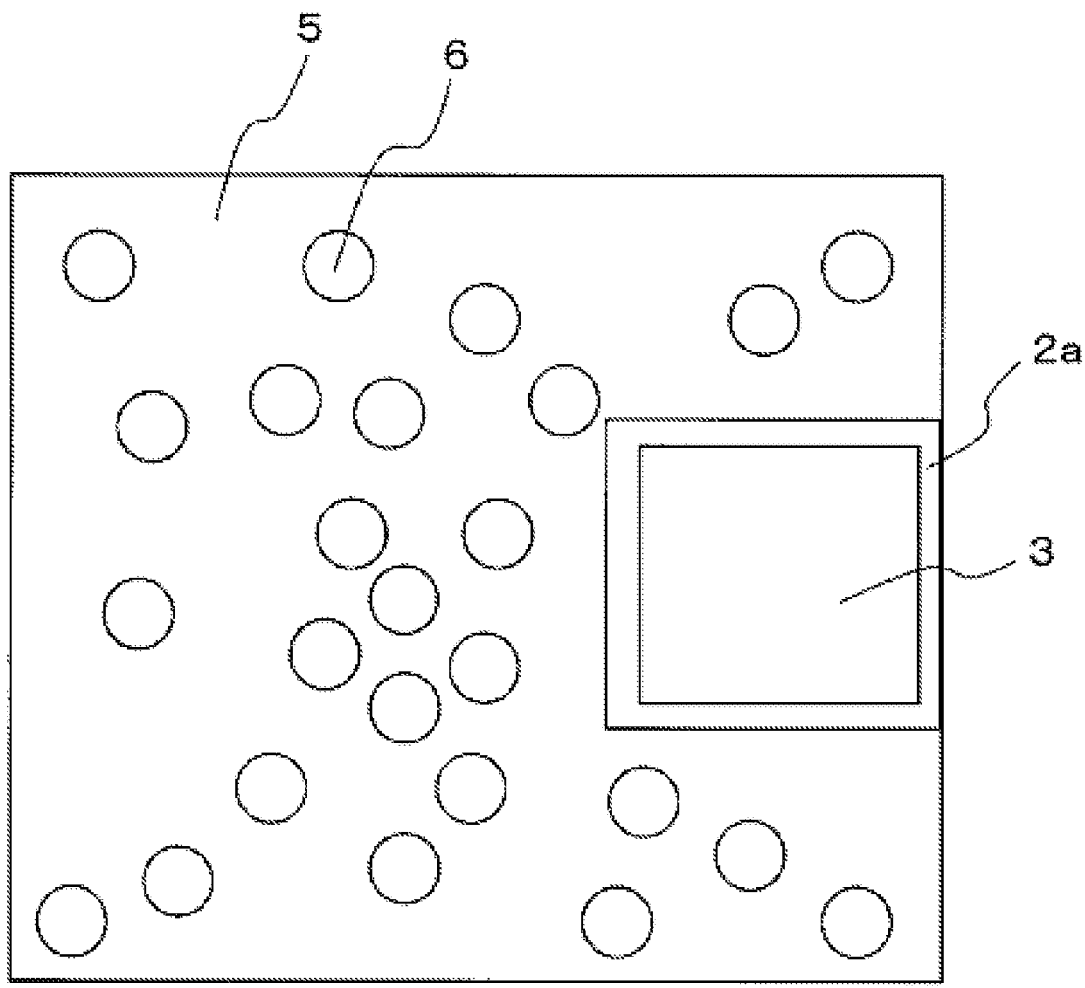
FIG. 7 is a plan view of a modified example of the light emitting element shown in FIG. 1, and corresponds to a view of the light emitting element as viewed from the top.

The conductive layer 5 may be provided such that the plurality of through holes 6 show a higher density along the inside thereof in a plan view, as shown in FIG. 7. Herein, the density of the plurality of through holes 6 provided in the conductive layer 5 represents a ratio of the area of the through holes 6 to the area of the conductive layer 5 as the conductive layer 5 is viewed in a plan view.

When the conductive reflecting layer 4 and the second semiconductor layer 2c are heated, oxygen penetrates not only from the surface of the conductive reflecting layer 4 exposed in the through holes 6 but also from the side faces of the conductive reflecting layer 4. For this reason, with the through holes 6 provided in such a density, it is possible to reduce the difference of oxygen amounts in a planar direction of the main face 2A of the second semiconductor layer 2c in the interfacial area in which the second semiconductor layer 2c comes into contact with the conductive reflecting layer 4.

As a result, it is possible to reduce a contact resistance value with the conductive reflecting layer 4 over the entire planar direction of the main face 2A of the second semiconductor layer 2c in a plan view.

Figure 8:
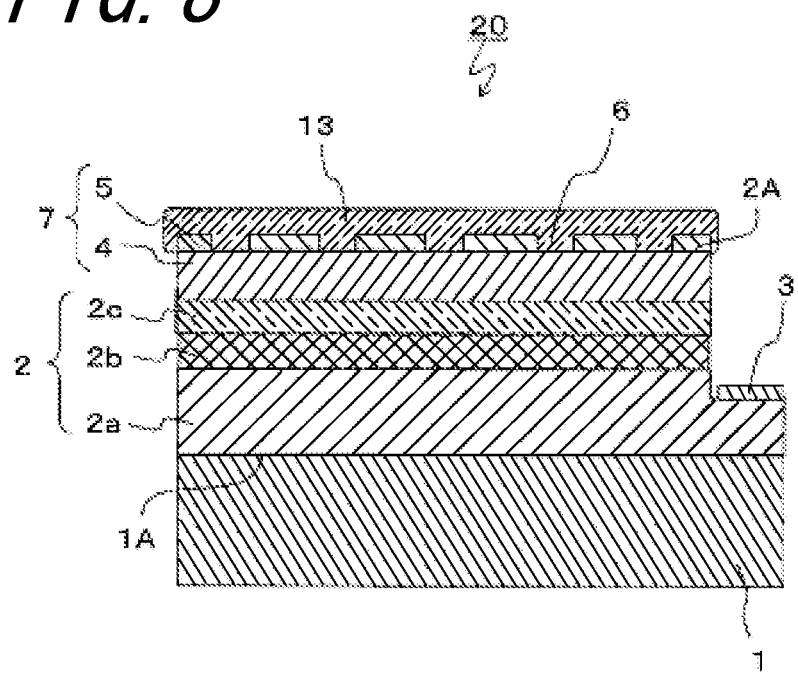
FIG. 8 is a cross-sectional view of a modified example of the light emitting element shown in FIG. 1, and corresponds to a cross-section taken along the line A-A' of FIG. 1.

As shown in FIG. 8, the light emitting element 20 may further include the protective metal layer 13. Specifically, the protective metal layer 13 may be provided so as to fill the through holes 6 and cover the surface of the conductive layer 5. The thermal expansion coefficient of a material contained in the protective metal layer 13 is set so as to be smaller than the thermal expansion coefficient of a material contained in the conductive layer 5.

By forming the protective metal layer 13 with a material having a smaller thermal expansion coefficient than that of the second electrode layer 5, it is possible to prevent deformation of the conductive layer 5 caused by thermal expansion. By filling the through holes 6 with the material of the protective metal layer 13, it is possible to suppress thermal expansion of the conductive layer 5 in the horizontal direction. As a result, the protective metal layer 13 can suppress detachment of the conductive layer 5 from the conductive reflecting layer 4 by heat, and prevent poor connection between the conductive layer 5 and the conductive reflecting layer 4.

Specifically, when aluminum (thermal expansion coefficient of $30.2 \times 10^{-6}$ [$K^{-1}$]) is used for the conductive layer 5, it is possible to use, for the protective metal layer 13, tantalum (thermal expansion coefficient of $63 \times 10^{-6}$ [$K^{-1}$]), gold (thermal expansion coefficient of $14.2 \times 10^{-6}$ [$K^{-1}$]), tin (thermal expansion coefficient of $22.0 \times 10^{-6}$ [$K^{-1}$]), copper (thermal expansion coefficient of $16.5 \times 10^{-6}$ [$K^{-1}$]), nickel (thermal expansion coefficient of $13.4 \times 10^{-6}$ [$K^{-1}$]), or the like as a single material or an alloy thereof. Furthermore, the exemplified thermal expansion coefficient is a value of 273K.

Furthermore, when the recess 12 is provided in the conductive reflecting layer 4, the recess 12 may be filled with the protective metal layer 13. When the material of the protective metal layer 13 fills the recess 12, a material with a smaller thermal expansion coefficient than that of the material of the conductive reflecting layer 4 and the material of the conductive layer 5 may be used for the protective metal layer 13.

In the embodiment, since silver (thermal expansion coefficient of $18.9 \times 10^{-6}$ [$K^{-1}$]) is used for the conductive reflecting layer 4, it is possible to use tantalum (thermal expansion coefficient of $6.3 \times 10^{-6}$ [$K^{-1}$]), gold (thermal expansion coefficient of $14.2 \times 10^{-6}$ [$K^{-1}$]), copper (thermal expansion coefficient of $16.5 \times 10^{-6}$ [$K^{-1}$]), nickel (thermal expansion coefficient of $13.4 \times 10^{-6}$ [$K^{-1}$]), or the like as a single material or an alloy thereof. Furthermore, in a viewpoint of conductivity, or the like while taking the thermal expansion coefficient into consideration, an alloy such as an alloy of tantalum and gold (thermal expansion coefficient within a range of $6.3 \times 10^{-6}$ [$K^{-1}$] or more and $14.2 \times 10^{-6}$ [$K^{-1}$] or less) may be used for the protective metal layer 13.

In the embodiment, since the second semiconductor layer 2c contains a gallium nitride, when the second semiconductor layer 2c and the conductive reflecting layer 4 are heated, it may be possible that a gallium oxide is contained in the interfacial area where the second semiconductor layer 2c comes into contact with the conductive reflecting layer 4. By causing the second semiconductor layer 2c containing a gallium oxide in an interfacial area with the conductive reflecting layer, it is possible to lower a contact resistance value of the second semiconductor layer 2c and the conductive reflecting layer 4.

In the embodiment, since the conductive reflecting layer 4 contains silver, when the second semiconductor layer 2c and the conductive reflecting layer 4 are heated, the conductive reflecting layer 4 comes to contain a silver oxide. Specifically, the conductive reflecting layer 4 is easily oxidized from the exposure portion of the upper face 4A of the conductive reflecting layer 4 that is exposed the through holes 6 and the conductive layer 5 and from side face portions of the conductive reflecting layer 4. For this reason, the conductive reflecting layer 4 easily contains a silver oxide in the exposure portion and the side face portions.

Figure 9:
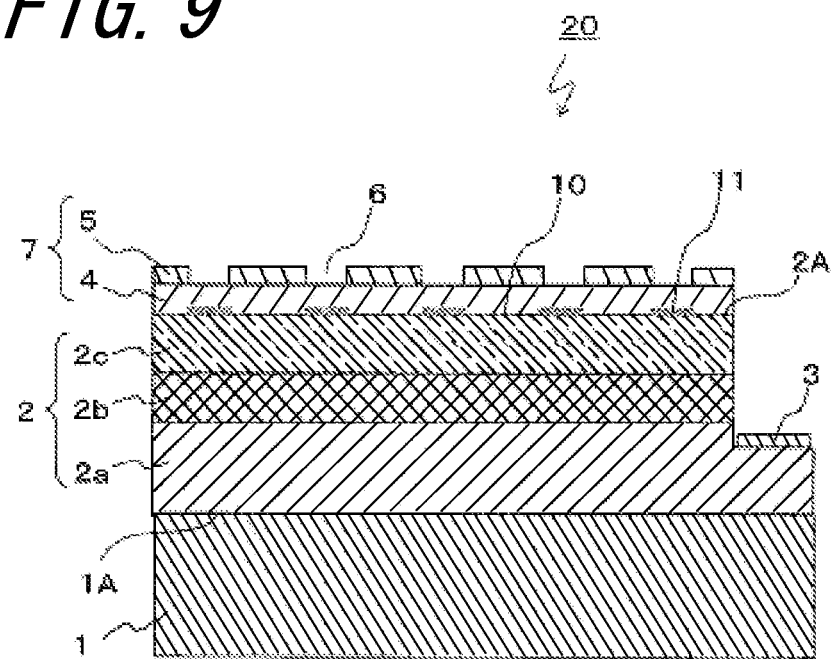
FIG. 9 is a cross-sectional view of a modified example of the light emitting element shown in FIG. 1, and corresponds to a cross-section taken along the line A-A' of FIG. 1.

As shown in FIG. 9, the conductive reflecting layer 4 may have first contact portions 10 and second contact portions 11 having lower electric resistance than the first contact portions 10 at portions where the conductive reflecting layer 4 comes into contact with the second semiconductor layer 2c. An electric resistance value of the first contact portion 10 and an electric resistance value of the second contact portion 11 can be configured to change a contact resistance value in the contact interface of the second semiconductor layer 2c and the conductive reflecting layer 4.

As a method of changing a contact resistance value, for example, it is possible to configure the second semiconductor layer 2c and the conductive reflecting layer 4 to have ohmic contact. As an example of ohmic contact, for example, it is possible to change an electric resistance value by changing the amount of oxygen in the contact interface of the periphery of the contact interface. If a case is exemplified where silver is used for the conductive reflecting layer 4, the second contact portions 11 easily contain a large amount of silver oxide.

In the embodiment, the second electrode layer 7 has the through holes 6 that expose part of the upper face of the conductive reflecting layer 4 at portions overlapping with the second contact portions 11 in a transparent plan view. In addition, since the second contact portions 11 have smaller electric resistance than the first contact portions 10, current easily flows from the first contact portions 10 to the second contact portions 11, and a large amount of heat is generated in the second semiconductor layer 2c contacting with the second contact portions 11.

For this reason, as the through holes 6 formed in the conductive layer 5 are positioned at portions overlapping with the second contact portions 11 in a transparent plan view, it is possible to shorten a heat radiation path of the outside and the second contact portions 11 that easily reach high temperature, thereby enhancing the heat dissipation efficiency. As a result, it is possible to stabilize the temperature of the second semiconductor layer 2c and to enhance light emission efficiency.

Figure 10:
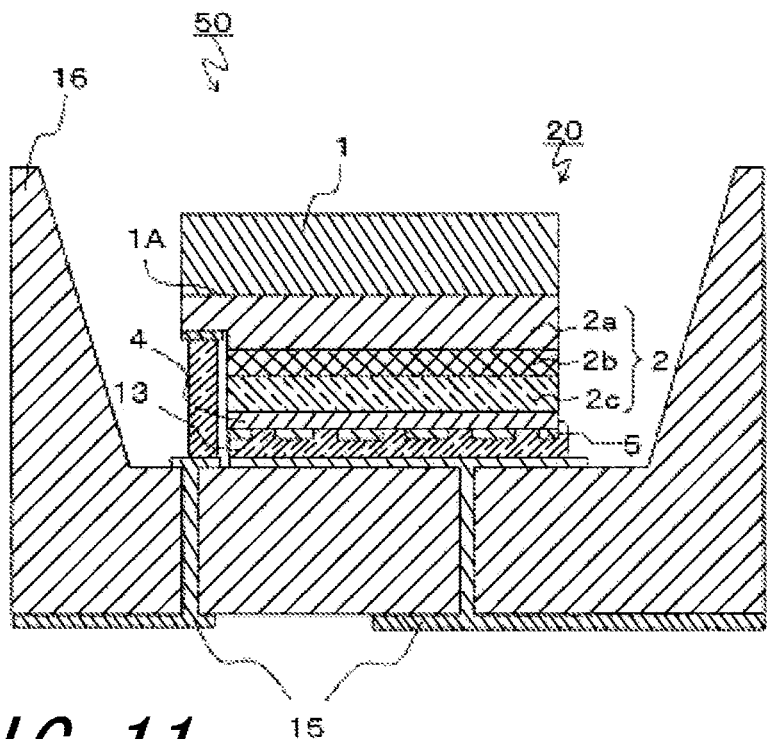
FIG. 10 is a light emitting device equipped with the light emitting element shown in FIG. 1 as a package.

Furthermore, as shown in FIG. 10, when the light emitting element 20 is flip-chip mounted in a package body 16 to form a light emitting device 50, such a protective metal layer 13 may be used as a bump that bonds a wiring electrode 15 of the package body 16 and the light emitting element 20. By using such a protective metal layer 13 as a bump, it is possible to prevent poor connection caused by heat generated between the wiring electrode 15 and the second electrode layer 7, in comparison to a case where the wiring electrode 15 is bonded without the protective metal layer 13.

As a material of the protective metal layer 13, a material having lower electric resistance than that of the conductive layer 5 may be used. In the embodiment, since the conductive reflecting layer 4 is made of silver (electric resistance value of 1.47 $[10^{-8} \Omega \cdot m]$), the second electrode layer 5 having the through holes 6 is made of aluminum (electric resistance value of 2.50 $[10^{-8} \Omega \cdot m]$), and the protective metal layer 13 is electrically connected to the conductive reflecting layer 4 through the through holes 6, it is possible to further lower power consumption, in comparison to a case where the through holes 6 are not provided. Furthermore, the exemplified electric resistance value is a value of 273K.

Furthermore, the light emitting element 20 may be sealed with a protective resin layer. As a protective resin layer, for example, it is possible to use a silicone resin, or the like. When the light emitting layer 2b emits light with a wavelength within a range of 350 nm or more and 500 nm or less, light from the light emitting layer 2b may be converted into white light by mixing a fluorescent material or phosphorescent material that can be excited with the wavelength of the emitted light into such a silicone resin.

<Regarding Method for Manufacturing Light Emitting Element>

Next, a method for manufacturing the light emitting element 20 will be described. FIGS. 11 to 16 show cross-sectional views for illustrating the method for manufacturing the light emitting element 20, and show the portion corresponding to the cross-section of the light emitting element 20 taken along the line of A-A' shown in FIG. 1. The same reference numerals are given to the overlapping portion with the light emitting element 20 described above, and description thereof will be omitted.

(Step for Preparing Stacked Body)

Figure 11:
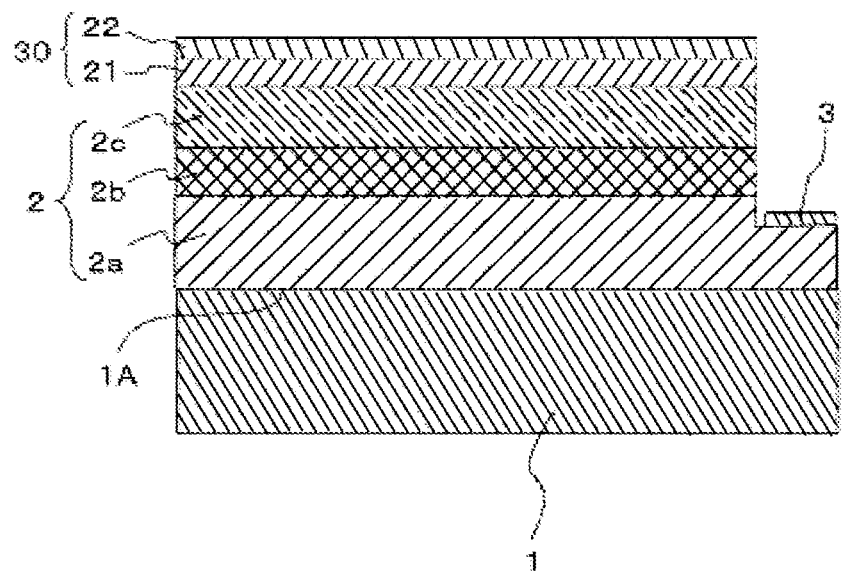
FIG. 11 is a cross-sectional view of the light emitting element showing a manufacturing process of the light emitting element shown in FIG. 1.

As shown in FIG. 11, the optical semiconductor layer 2 obtained by sequentially laminating the first semiconductor layer 2a, the light emitting element 2b, and the second semiconductor layer 2c is formed on the substrate 1. For the optical semiconductor layer 2, it is possible to use a mixed crystal of a nitride containing at least one of, for example, gallium, indium, and aluminum.

As a growth method of the optical semiconductor layer 2, molecular beam epitaxy (abbreviated as MBE), metal organic vapor phase epitaxy (abbreviated as MOVPE), hydride vapor phase epitaxy (abbreviated as HYPE), pulsed laser deposition (abbreviated as PLD), or the like is used. When light emitted from the optical semiconductor layer 2 is taken out from the side of the substrate 1, a method in which the optical semiconductor layer 2 is caused to grow on the substrate 1 and then the substrate 1 is removed may be used.

After that, a stacked body 30 obtained by sequentially laminating a first metal layer 21 and a second metal layer 22 is formed on the second semiconductor layer 2c of the optical semiconductor layer 2. For the first metal layer 21, the material for the conductive reflecting layer 4 can be used, and for the second metal layer 22, the material for the conductive layer 5 can be used. It is preferable that the second metal layer 22 is made of a material having a higher melting point that that of an oxide of the first metal layer 21. Furthermore, the materials of the first metal layer 21 and the second metal layer 22 is selected from the above-described material of the conductive reflecting layer 4 or of the conductive layer 5.

The method of laminating the first metal layer 21 and the second metal layer 22 can use any of sputtering, deposition, and the like. The laminating method may be appropriately selected according to the materials to be laminated. The thickness of the first metal layer 21 can be appropriately changed according to the reflectance of the selected material, and can be set to be, for example, within a range of 10 nm or more and 5000 nm or less. The thickness of the second metal layer 22 can be set to be, for example, within a range of 1 nm or more and 50 nm or less.

In the embodiment, the first metal layer 21 is made of a material having silver as the main component, and the second metal layer 22 is made of a material having aluminum as the main component.

(Step of Forming Plural Through Holes)

Next, the plurality of through holes 6 which penetrate in the thickness direction of the second metal layer 22 are formed in the second metal layer 22. As a method of forming the through holes 6, for example, it is possible to use a photolithography method or a lift-off method that uses a mask such as a resist. In this embodiment, the photolithography method is used. When the lift-off method or the like is used, it may be possible to have a step of providing a resist pattern on the first metal layer 21 in the step of laminating the above-described stacked body 30. As another method, it is possible to use a focused ion beam (abbreviated as FIB), or the like. When the photolithography method or the lift-off method is used, the plurality of through holes 6 can be simultaneously formed, and therefore, it is possible to form the through holes 6 with high productivity.

A case where the through holes 6 are formed using the photolithography method will be described.

Figure 12:
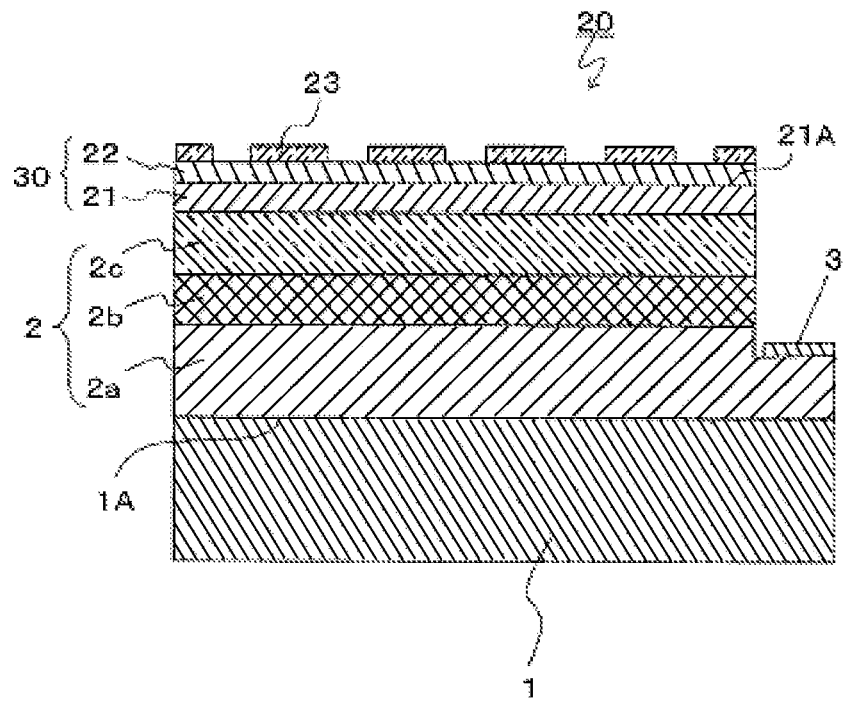
FIG. 12 is a cross-sectional view of the light emitting element showing the manufacturing process of the light emitting element shown in FIG. 1.
Figure 13:
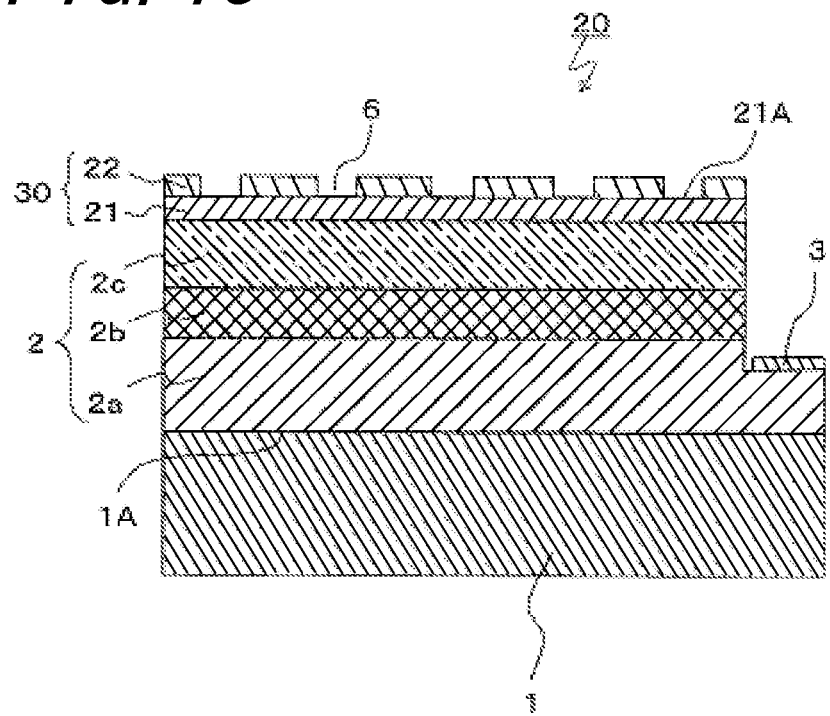
FIG. 13 is a cross-sectional view of the light emitting element showing the manufacturing process of the light emitting element shown in FIG. 1.

First, as shown in FIG. 12, resists 23 that expose part of the second metal layer 22 which causes to form the through holes 6 are formed on the second metal layer 22. Etching is performed from the surface of the second metal layer 22 that is exposed from the resists 23 to the depth of exposing an upper face 21A of the first metal layer 21, and part of the second metal layer 22 is removed. After that, by removing the resists 23, it is possible to form the plurality of through holes 6 on the second metal layer 22 as shown in FIG. 13. In the embodiment, a diameter of the through hole 6 is set to be, for example, within a range of 0.2 µm or more and 20 µm or less.

As an etching method of removing part of the second metal layer 22, it is possible to use a wet etching method or a dry etching method. When the wet etching method is used to remove part of the second metal layer 22, a chemical solution having a high etching rate to the second metal layer 22 and a low etching rate to the first metal layer 21 can be used as an etching solution. By using such a chemical solution as an etching solution, it is possible to remove the second metal layer 22 while suppressing removal of the first metal layer 21 beyond expectation, and to perform selective etching for the second metal layer 22.

By forming the plurality of through holes 6, part of the first metal layer 21 that is exposed from the second metal layer 22 easily undergoes natural oxidization. In this embodiment, since the first metal layer 21 has silver as the main component, part of the first metal layer 21 that is exposed from the second metal layer 22 easily contains a large amount of oxidized silver.

(Step of Heating Stacked Body)

After that, the stacked body 30 including the first metal layer 21 and the second metal layer 22 formed the through holes 6 is heated. By heating the staked body 30 as such, the second semiconductor layer 2c is also heated. The temperature for heating the stacked body 30 can be set to be, for example, temperature that is higher than the melting point of an oxide of the first metal layer 21 and lower than a melting point of the first metal layer 21 and the melting point of the second metal layer 22.

Figure 14:
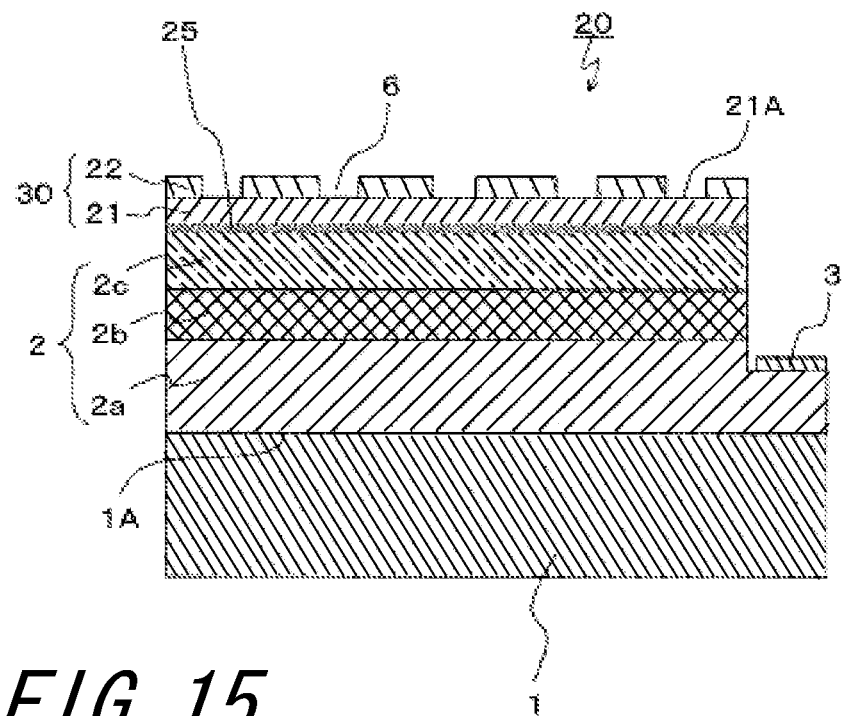
FIG. 14 is a cross-sectional view of the light emitting element showing the manufacturing process of the light emitting element shown in FIG. 1.

By heating the stacked body 30 to the above temperature, it is possible to set the interfacial area in which the second semiconductor layer 2c comes into contact with the first metal layer 21 to be an ohmic contacting portion 25 that undergoes ohmic contact as shown in FIG. 14 with suppressing the agglomeration of the first metal layer 21.

Herein, the interfacial area in which the second semiconductor layer 2c comes into contact with the first metal layer 21 refers to an area in the range of, for example, 20 nm to each layer from the contacting face where the atomic concentration of the second semiconductor layer 2c is the same as the atomic concentration of the first metal layer 21.

In addition, ohmic contact is contact between a metal and a semiconductor that has an extremely small contact resistance value, in comparison to a series resistance value by resistance of a semiconductor bulk. In other words, ohmic contact refers to contact that causes a small voltage drop in comparison to a voltage drop in an operation area of a device. A contact resistance value in the case of ohmic contact is set to be, for example, 0.012 $\Omega \cdot cm^2$ or less.

When the stacked body 30 is heated, oxygen passes through the through holes 6 and penetrates into the first metal layer 21 as the second metal layer 22 has the through holes 6, and therefore, it is possible to increase the amount of oxygen over the interfacial area in which the second semiconductor layer 2c comes into contact with the first metal layer 21. As a result, it is possible to make ohmic contact in the interfacial area in which the second semiconductor layer 2c comes into contact with the first metal layer 21.

As a method of making ohmic contact in the interfacial area in which the second semiconductor layer 2c comes into contact with the first metal layer 21, it is possible to use a method of forming oxides to the lower face of the first metal layer 21, a method of dispersing oxygen to the first metal layer 21, or the like.

Since it is possible to have the second semiconductor layer 2c and the first metal layer 21 undergo ohmic contact in the interfacial area in which the second semiconductor layer 2c comes into contact with the first metal layer 21, it is possible to lower the contact resistance value between the second semiconductor layer 2c and the first metal layer 21. For this reason, it is possible to easily make current flow from the first metal layer 21 to the second semiconductor layer 2c. As a result, current flows over the interfacial area in which the second semiconductor layer 2c comes into contact with the first metal layer 21 with ease, and therefore, it is possible to reduce unevenness, or the like, in light emission of light emitted from the optical semiconductor layer 2.

In the embodiment, first metal layer 21 contains silver (melting point: 961° C.), an oxidized first metal layer 21 contains a silver oxide (melting point: 280° C.), and the second metal layer 22 contains aluminum (melting point: 660° C.), as the main component respectively. Based on this point, temperature for heating the stacked body 30 can be set to be, for example, within a range of 300° C. or more and 600° C. or less.

When the melting point of a material used in the first metal layer 21 and the second metal layer 22 is different from that of the material of the main component, heating temperature may be appropriately set considering the melting point. Specifically, as a material used for the first metal layer 21 and the second metal layer 22, there is a case where an alloy material, a material containing impurities, or the like is used.

In addition, the range of ohmic contact in the interfacial area in which the second semiconductor layer 2c comes into contact with the first metal layer 21 can be adjusted according to a heating temperature, a heating time, or the like, of the stacked body 30.

Whether or not the second semiconductor layer 2c and the first metal layer 21 are in ohmic contact can be ascertained by a method, for example, of examining the amount of oxygen in the interfacial area between the second semiconductor layer 2c and the first metal layer 21. As another method, a method of measuring a contact resistance value between the second semiconductor layer 2c and the first metal layer 21 can be used.

The amount of oxygen in the interfacial area between the second semiconductor layer 2c and the first metal layer 21 can be ascertained through analysis with an analysis method, for example, a dynamic-secondary ion-microprobe mass spectrometry (abbreviated as D-SIMS) method, an X-ray photoelectron spectroscopy (abbreviated as XPS) method, an Auger electron spectroscopy (abbreviated as AES) method, or the like. The D-SIMS method, the XPS method, or the AES method may use a method based on JIS K0146-2002, or the like.

(Regarding Various Modified Examples)

In the step of forming the plurality of through holes 6, after the through holes 6 are formed by etching the second metal layer 22 until the surface of the first metal layer 21 is exposed, the first metal layer 21 may be etched from the surface of the first metal layer 21. By successively performing etching of the first metal layer 21 after etching the second metal layer 22, it is possible to form the recess 12 at the position corresponding to the through holes 6 in the first metal layer 21 as shown in FIG. 4 or 5.

In the step of forming the plurality of through holes 6, the etching rates of the second metal layer 22 and the first metal layer 21 may be different each other. By setting an etching rate of the second metal layer 22 higher than an etching rate of the first metal layer 21, it is possible to provide the outer circumference of the first opening portion 8 of the through hole 6 so as to be positioned outside the outer circumference of the second opening portion 9 of the recess 12 in a transparent plan view as shown in FIG. 6.

In the step of heating the stacked body 30, the stacked body 30 may be heated in an oxygen atmosphere with higher oxygen concentration than in the air. By heating the stacked body 30 in the oxygen atmosphere, it is possible to perform more assured ohmic contact between the second semiconductor layer 2c and the first metal layer 21. Furthermore, by heating the stacked body 30 in atmosphere with higher oxygen concentration than in the air, it is possible to shorten the heating time for the step of heating the stacked body 30, whereby the productivity can be enhanced.

(Evaluation Result)

Figure 15:
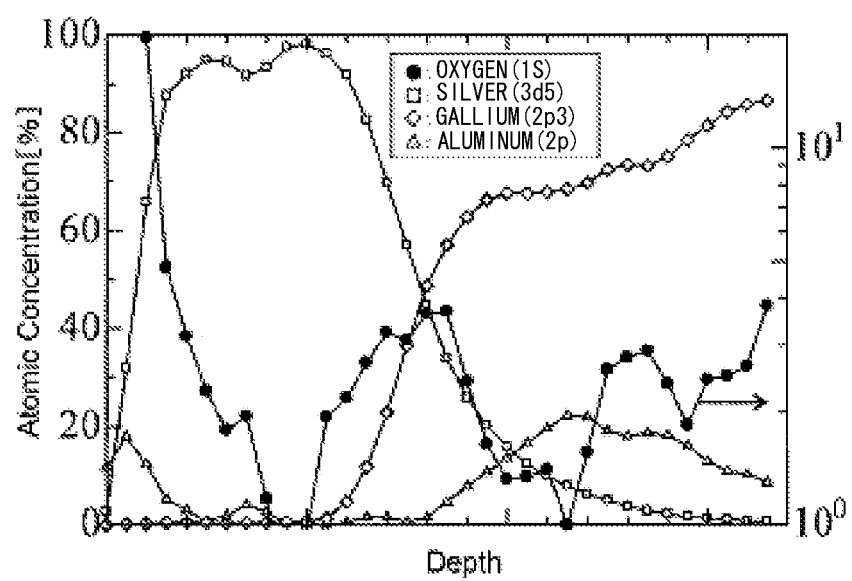
FIG. 15 is a graph showing an analysis result of the light emitting element shown in FIG. 1.

FIG. 15 shows a part of results of analyzing the light emitting element 20 according to the embodiment using the XPS method in the depth direction from the surface of the second metal layer 22. Specifically, atomic concentration of each of oxygen, silver, gallium, and aluminum present in the depth direction from the surface of the second metal layer 22 to the second semiconductor layer 2c is measured. In FIG. 15, the horizontal axis represents the depth from the second metal layer 22, the vertical axis represents the atomic concentration, and only the atomic concentration of oxygen is set to a value of a natural logarithm. As the sample used in the analysis by the XPS method of this time, one that underwent ohmic contact in the interfacial area where the second semiconductor layer 2c comes into contact with the first metal layer 21 was used.

As shown in FIG. 15, it is understood that the atomic concentration of oxygen increases in the interfacial area where the second semiconductor layer 2c comes into contact with the first metal layer 21, that is, an area where the atomic concentration of silver decreases and the atomic concentration of gallium increases. From this point, it is understood that the amount of oxygen increases in the interfacial area where the second semiconductor layer 2c comes into contact with the first metal layer 21. In this case, the contact face where the second semiconductor layer 2c comes into contact with the first metal layer 21 is the position where the atomic concentration of the second semiconductor layer 2c becomes equal to that of the first metal layer 21, that is, the position where the curve indicating the atomic concentration of the second semiconductor layer 2c intersects with the curve indicating the atomic concentration of the first metal layer 21, as shown in FIG. 15.

On the other hand, in a configuration where a second metal layer does not include through holes, since the penetration of oxygen to a first metal layer is blocked by a second metal layer, it was not possible to increase the amount of oxygen in the interfacial area where the second semiconductor semiconductor layer comes into contact with the first metal layer. As a result, it was not possible to make ohmic contact in the interfacial area where the second semiconductor layer comes into contact with the first metal layer.

Figure 16:
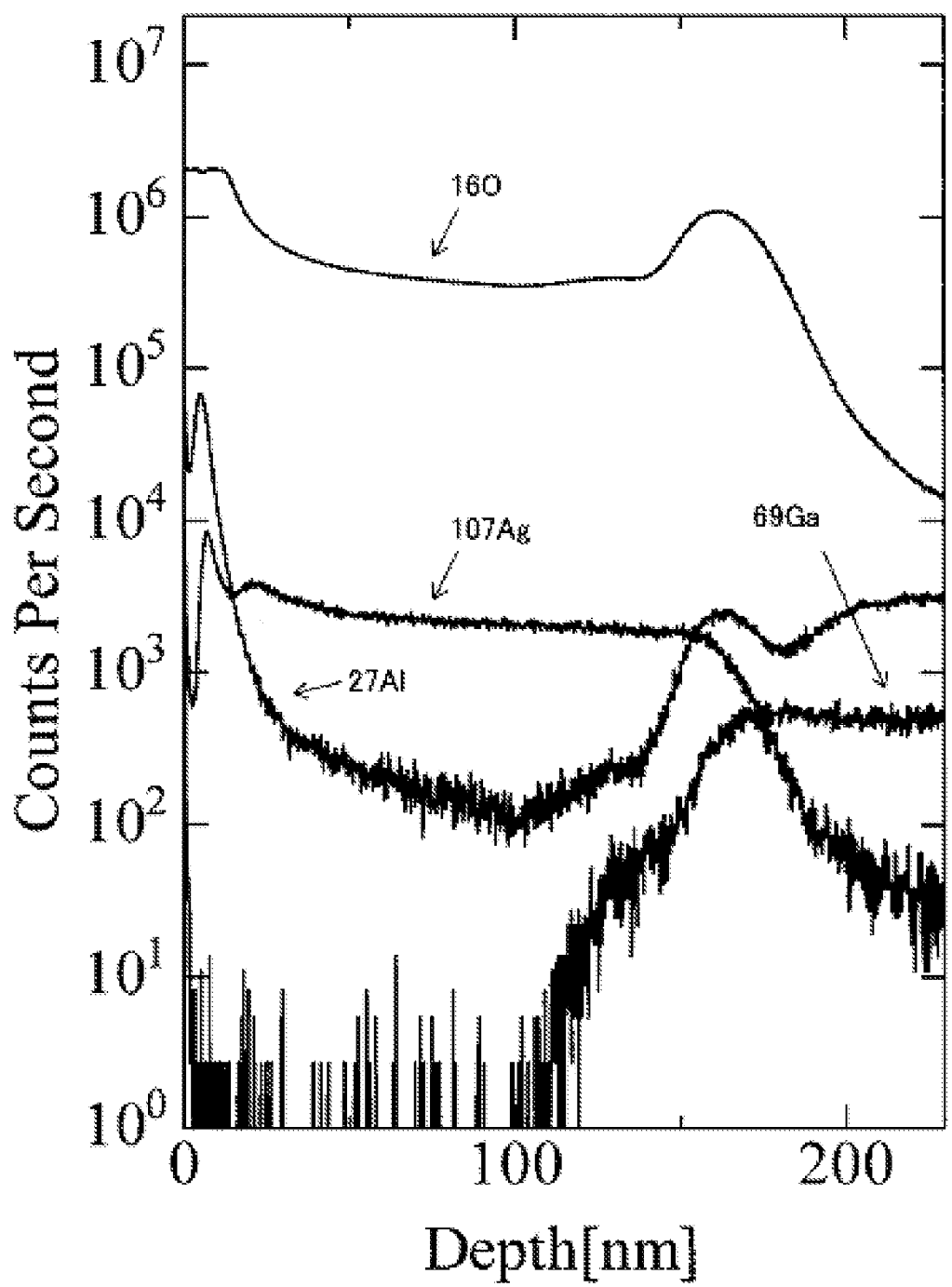
FIG. 16 is a graph showing an analysis result of the light emitting element shown in FIG. 1.
Figure 17:
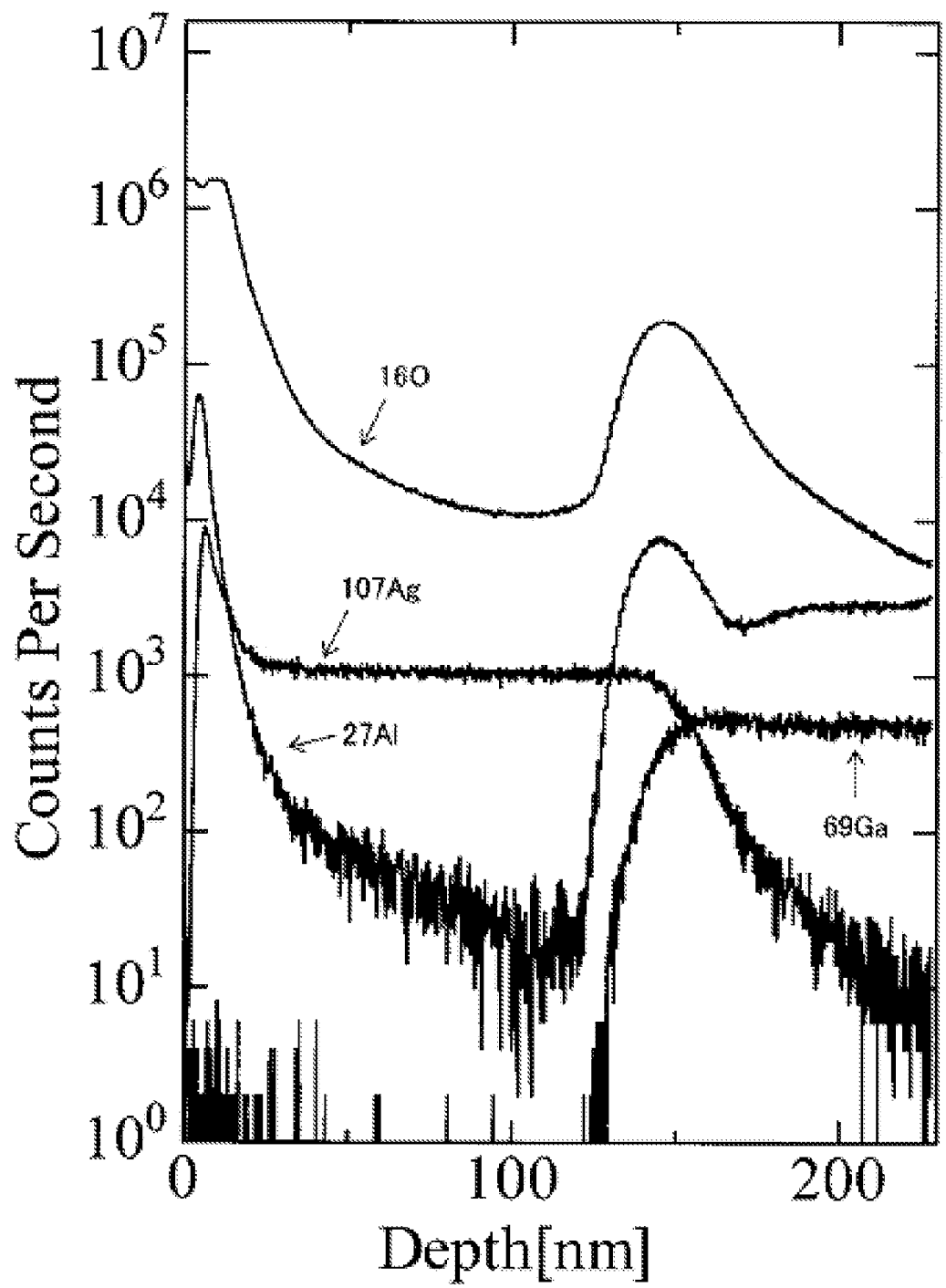
FIG. 17 is a graph showing an analysis result of a light emitting element of a comparative example.

Herein, FIG. 16 shows an analysis result when heating was performed in the configuration in which the second metal layer 22 includes the through holes 6 according to the above-described embodiment, and FIG. 17 shows an analysis result of a comparative example in which heating was performed in a configuration in which the second metal layer does not include through holes. FIGS. 16 and 17 are measurement results using the D-SIMS method in the depth direction from the surface of the second metal layer 22. Specifically, the amount of each of oxygen, silver, gallium, and aluminum present in the depth direction from the surface of the second metal layer 22 to the second semiconductor layer 2c was measured. In FIGS. 16 and 17, the horizontal axis represents the depth from the second metal layer 22 and the vertical axis represents the amount of each element.

As shown in FIGS. 16 and 17, it is understood that the case of the configuration in which the second metal layer 22 includes the through holes 6 in the interfacial area where the second semiconductor layer 2c comes into contact with the first metal layer 21 shows a relatively large amount of oxygen, which is about 10 times larger than in the case of the configuration in which the second metal layer does not include through holes.

As a result, whereas the light emitting element 20 according to the embodiment emits light over the entire face on which optical semiconductor layer 2 comes into contact with the first metal layer 22, in a light emitting element of the comparative example, current had a difficulty in flowing from the first metal layer to the second semiconductor layer in the interfacial area, and unevenness in light emission was shown. Furthermore, it was necessary to apply high voltage between the first electrode layer and the second electrode layer in order to cause the optical semiconductor layer to emit light, which caused an increase in power consumption.

On the other hand, when the optical semiconductor layer and the first metal layer were heated after forming the first metal layer with silver on the optical semiconductor layer without providing the second metal layer, silver is agglomerated, whereby it was not possible to form a conductive reflecting layer. On the other hand, when the heating temperature of the optical semiconductor layer and the first metal layer was set to low, it was not possible to form sufficient ohmic contact between the second semiconductor layer and the first metal layer.

When whether or not ohmic contact is formed between the second semiconductor layer 2c and the first metal layer 21 is ascertained with a method of measuring a contact resistance value between the second semiconductor layer 2c and the first metal layer 21, it is possible to use, for example, a transmission line model (abbreviated as TLM) method, or the like.

As a result of measuring the light emitting element manufactured with the above-described manufacturing method using the TLM method, the contact resistance value between the second semiconductor layer 2c and the first metal layer 21 was an electric resistance value that was 0.012 $\Omega \cdot cm^2$ or less.

What is claimed is:

1. A light emitting element, comprising:
an optical semiconductor layer in which a first semiconductor layer, a light emitting layer, and a second semiconductor layer are sequentially laminated;
a first electrode layer that is electrically connected to the first semiconductor layer; and
a second electrode layer that is electrically connected to the second semiconductor layer, and comprising:
a conductive reflecting layer positioned on the second semiconductor layer; and
a conductive layer positioned on the conductive reflecting layer, the conductive layer comprising a plurality of through holes penetrating therethrough in a thickness direction thereof, a part of a surface of the conductive reflecting layer being exposed, the second semiconductor layer containing a gallium oxide in an interfacial area with the conductive reflecting layer.

2. The light emitting element according to claim 1, wherein the conductive reflecting layer comprises recesses at portions thereof corresponding to the through holes.

3. The light emitting element according to claim 2, wherein each of the recesses includes a first cross-sectional area, which is an area of the cross-section that is perpendicular to the thickness direction of the conductive reflecting layer, increasing toward a side of the conductive layer.

4. The light emitting element according to claim 2, wherein
the conductive layer comprises a first opening portion, that is an opening portion in an end side of the through holes, in a surface of the conductive layer on a side of the conductive reflecting layer,
the conductive reflecting layer comprises a second opening portion, that is an opening portion of the recesses, in a surface of the conductive reflecting layer on a side of the conductive layer, and
an outer circumference of the first opening portion is positioned outside an outer circumference of the second opening portion in a transparent plan view.

5. The light emitting element according to claim 1, wherein each of the through holes includes a second cross-sectional area, which is an area of the cross-section that is perpendicular to the thickness direction of the conductive layer, decreasing toward a side of the conductive reflecting layer.

6. The light emitting element according to claim 1, wherein the conductive layer includes a density of the through holes which increases toward an inner side thereof in a plan view.

7. The light emitting element according to claim 1, further comprising:
a protective metal layer filling the through holes and covering the surface of the conductive layer,
wherein a thermal expansion coefficient of a material constituting the protective metal layer is smaller than a thermal expansion coefficient of a material constituting the conductive layer.

8. The light emitting element according to claim 1, wherein the conductive reflecting layer contains a silver oxide.

9. The light emitting element according to claim 8, wherein a thickness of the conductive reflecting layer is 20 nm or more.

10. The light emitting element according to claim 1, wherein the conductive layer contains aluminum.

11. The light emitting element according to claim 10, wherein a thickness of the conductive layer is within a range of 1 nm or more and 30 nm or less.

12. A method for manufacturing a light emitting element, comprising:
preparing a stacked body obtained by sequentially laminating an optical semiconductor layer, a first metal layer, and a second metal layer having a higher melting point than that of an oxide of the first metal layer;
forming a plurality of through holes that penetrate the second metal layer in a thickness direction thereof; and
oxidizing an interfacial area of the optical semiconductor layer with the first metal layer by heating the stacked body at a temperature that is higher than the melting point of an oxide of the first metal layer and is lower than a melting point of the first metal layer and the melting point of the second metal layer.

13. The method for manufacturing a light emitting element according to claim 12, further comprising:
forming recesses at portions of the first metal layer corresponding to the through holes.

14. The method for manufacturing a light emitting element according to claim 12, wherein the heating of the stacked body is performed in an oxygen atmosphere.

15. A light emitting element, comprising:
an optical semiconductor layer in which a first semiconductor layer, a light emitting layer, and a second semiconductor layer are sequentially laminated;
a first electrode layer that is electrically connected to the first semiconductor layer; and
a second electrode layer that is electrically connected to the second semiconductor layer, and comprising:
a conductive reflecting layer positioned on the second semiconductor layer; and
a conductive layer positioned on the conductive reflecting layer, the conductive layer comprising a plurality of through holes penetrating therethrough in a thickness direction thereof, a part of a surface of the conductive reflecting layer being exposed,
the conductive reflecting layer comprising recesses at portions thereof corresponding to the through holes, and
each of the recesses including a first cross-sectional area, which is an area of the cross-section that is perpendicular to the thickness direction of the conductive reflecting layer, increasing toward a side of the conductive layer.

* * * * *